United States Patent [19]

Völker et al.

[11] Patent Number: 5,572,171
[45] Date of Patent: Nov. 5, 1996

[54] SIGNAL DISTRIBUTION SYSTEM WITH PLURAL LINES SEGMENTS IN A PATH AND HAVING VARYING SENSITIVITIES

[75] Inventors: Michael Völker; Rolf Zahn, both of Markdorf, Germany

[73] Assignee: Dornier GmbH, Germany

[21] Appl. No.: 225,285

[22] Filed: Apr. 8, 1994

[30]     Foreign Application Priority Data

Apr. 8, 1993 [DE] Germany .......................... 43 11 601.9

[51] Int. Cl.⁶ .................................................. H03H 11/36
[52] U.S. Cl. ........................... 333/100; 333/136; 343/853
[58] Field of Search ................................ 333/1, 100, 136; 343/853

[56]     References Cited

U.S. PATENT DOCUMENTS

| | | | |
|---|---|---|---|
| 4,356,462 | 10/1982 | Bowman | 333/136 X |
| 4,742,355 | 5/1988 | Wolfson et al. | 343/771 X |
| 4,780,723 | 10/1988 | Mead | 343/853 X |
| 5,278,524 | 11/1994 | Mullen | 333/1 |

Primary Examiner—Benny Lee
Attorney, Agent, or Firm—Evenson, McKeown, Edwards & Lenahan P.L.L.C.

[57]     ABSTRACT

A signal distribution arrangement having a central signal source and a plurality of signal receivers located along a common path. Each of the signal receivers is coupled in communication with the signal source by a line arranged within the common path. To eliminate distortion of the signal due to outside interference sources, each of the lines is arranged within the common path so that it traverses the common path an odd number of times between the signal source and the receiver to which it is coupled, and traverses the common path an even number of times between the receiver to which it is coupled and the end of the common path. Within each segment of the common path, the relative propagation sensitivity of each line is controlled such that the product of the number of times the line traverses that segment multiplied the relative propagation sensitivity of the line is the same for all lines. The arrangement according to the invention can also be applied to signal collection apparatus such as receiving antennas.

10 Claims, 4 Drawing Sheets

METAL BAND CARRIER (A FEW cm WIDE)

———— FIBER GUIDE FOR 1 1/2 AND 2 TIMES THE THERMAL COEFFICIENT

---------- FIBER GUIDE FOR SINGLE THERMAL COEFFICIENT

METAL BAND CARRIER (A FEW cm WIDE)

———— FIBER GUIDE FOR 1 1/2 AND 2 TIMES THE THERMAL COEFFICIENT

---------- FIBER GUIDE FOR SINGLE THERMAL COEFFICIENT

SIGNAL DISTRIBUTION SYSTEM WITH PLURAL LINES SEGMENTS IN A PATH AND HAVING VARYING SENSITIVITIES

BACKGROUND AND SUMMARY OF THE INVENTION

This invention relates to a method and apparatus for distributing a centrally generated signal to several signal receivers. For example such a device is used in electromagnetic multi-element antennas in which a centrally generated signal is distributed to the transmitting and receiving modules of the antenna.

When signals are transmitted, the phase at the end of the transmission path differs from that of the input signal as a function of the signal frequency and the signal transit time. During operation, the signal is subjected to external disturbing influences (such as a change of the thermal environment), which, when the signal frequencies are high and/or the signal paths are long, may result in unacceptably high phase errors. (Signals may, for example, be electric, electromagnetic, acoustic or other type of radiation, and are carried in suitable media—herein called lines.) The signal speed in the conductor may be influenced, for example, by the ambient temperature, ambient pressure, mechanical deformations, tensile, pressure, shearing and bending stresses, electric and magnetic fields, acoustic waves or radiation of different origins.

Currently, basically two different approaches are used to suppress externally caused perturbation of the propagation duration along the lines in the different channels of a network. On the one hand, the network is shielded from external disturbances, or their influence is reduced, by means of special casings, which often results in considerable additional (generally mechanical) expenditures. Another approach consists of individually delaying the signal for each line in such a manner that, after the transmission, the signal passes through the nominal overall delay. In the case of electromagnetic multi-element antennas, such as satellite-supported large-surface synthetic aperture radar ("SAR") antennas, this approach is often implemented by means of phase adjusters. For this purpose, it is necessary to determine the actual signal transit time in the line, which must be measured in calibration cycles for each line. For example, in X-band antennas, the transit time must be stable to better than 1 ps, which corresponds to a propagation path in the vacuum of 0.3 mm.

It is an object of the present invention to provide a signal distribution network, in which external interference can be compensated with as little expenditure as possible, and in particular without calibration cycles or shielding.

This object is achieved by the network for distribution of a centrally generated signal to several signal receivers according to the invention, in which each path segment exhibits a sensitivity to external influences which can be determined at the time of the design. This location-x-dependent (or location-s-dependent) influence or disturbance (called $T(x)$) may be, for example, the temperature distribution along the line. (The coordinate x represents the location along the path followed by the lines, while the coordinate s represents the location along the line itself. That is, as explained below, the exact routing (and hence length) of the line itself within the path x may be varied, so that $s=f(x)$.) The invention, recognizes and takes into account the fact that while the influence of a $T(x)$-fluctuation cannot be suppressed or cancelled out, effective suppression can be achieved in the action of lines relative to one another.

According to the invention, the arrangement comprises the following characteristics:

The lines follow a common path x, from which branches exit for the individual signal receivers. As a result, the lines are subjected to the same external influences.

Within the common path x, the individual lines s extend beyond the i-th signal receiver to which they are coupled, to the end of the common path, and then are turned back on themselves (looped) in such a manner that the path segment from the signal source to the i-th signal receiver (signal receivers along the common path being numbered sequentially by consecutive indices i) is traversed by an odd number of strands of the line s, while the path segment from the i-th signal receiver to the end of the common path is traversed by an even number of strands.

The individual lines are divided into two segments which have different relative sensitivities; and For each path segment $\Delta x$ along the common path, the number of strands of a line multiplied by the relative sensitivity E of the line is a constant for all lines.

For the purpose of the foregoing, relative sensitivity (sometimes referred to as relative propagation sensitivity) E can be derived as follows:

The total transit time of a signal through a line s along path x, given a propagation speed $c(T(s))$, is as follows:

$$t = \int \frac{1}{c(T(s))} \, ds, \qquad \text{(Equation 1)}$$

which may also be expressed as a function of the path x as:

$$t = \frac{P \cdot s'(x)}{C_o(T(x))} \, dx \qquad \text{(Equation 2)}$$

where $s'(x) = \frac{\partial s}{\partial x}$ (the first derivative of s with respect to x)

and $C_o(T(x))$=propagation speed of the signal in a standard line—as a function of the external influence or disturbance $T(x)$ at location x and p=ratio between the propagation speed of the signal in a line which has been altered (for example, by doping) relative to that of a standard line selected for $C_o(T(x))$, so that $$p = \frac{C_o(T)}{C(T)}$$

$$\frac{1}{C(T)} = \frac{P}{C_o(T)}.$$

For most purposes it is satisfactory to calculate p as the ratio of the derivatives of $c_o(T)$ and $c(T)$ with respect to the disturbance T:

$$p = \frac{\frac{\partial C_o(T)}{\partial T}}{\frac{\partial C(T)}{\partial T}}$$

The product $s'*p$ in Equation 2 above is referred to as relative sensitivity E. The incremental path element ds is measured along the line itself, while the coordinate x is related to distance along the common path (that is, the path followed by the grouping into which the lines are combined).

The relative sensitivity E can be adjusted in two ways:

1. As noted previously, the relationship of the line length increment ds to the path length increment dx can be adjusted when the line path has sufficient freedom of design. That is, for example, if x follows a relatively "straight" path for the grouping of lines, values for ds/dx which are greater than or equal to 1 can be adjusted by looping and winding the locus of the line s within path x. A uniform ds/dx along the path x can be achieved, for example, by laying the line in a constant diameter, constant slope helix within the path x. The ratio ds/dx can be adjusted by altering the slope of the helix. It may also be advantageous to reverse the rotational direction of the helix within the path x when external influences are to be suppressed (for example, in the case of electromagnetic irradiation).

2. The relative sensitivity E may also be adjusted by selection of the line material or by suitable doping (variation of p), so that the number of wave cycles of the signal per unit of length is changed.

Applications of the invention relate particularly to groupings of lines which terminate at different locations, and which relative to one another upon varying T(x) change their phase propagation speed as little as possible across each cross section. In the case of SAR-antennas which are subjected to extreme thermal fluctuations, a network therefore can be achieved in which phase fluctuations or transit time fluctuations of the individual channels relative to one another are suppressed, without need of special shielding, and without constant reconfiguration of the network. In addition, the arrangement according to the invention can be used for the distribution of signals having high carrier frequencies, such as optical signals, with drastically reduced sensitivity to outside disturbances.

It should be noted that it is unimportant in this case whether the lines are centrally guided together again. Also, the network may be operated in either direction, so that in addition to signal distribution, the arrangement according to the invention may also be used for collection of signals (in other words, signal reception in the case of a multi-element antenna). In the latter case (collection of signals), the central signal source is replaced by a central receiver, and the signal receivers are replaced by devices for signal input.

With respect to the grouping of lines, it should also be noted that the disturbance T(x) varies little in the transverse direction at any location along the grouping. The quality of this uniformity, of course, depends on the diameter, on the matrix into which the lines are embedded as shown in FIG. 7 and on the physical variation of the disturbance T. For example, heat-conducting materials are suitable for the embedding and a heat-insulating layer is very suitable as a covering in order to reduce thermal gradients, such as shown, for example, in FIG. 7 wherein a plurality of lines are embedded in a matrix, which is surrounded by an insulating layer. See also, FIG. 5 which shows a plurality of lines surrounded by an insulation layer.

Other objects, advantages and novel features of the present invention will become apparent from the following detailed description of the invention when considered in conjunction with the accompanying drawings.

DETAILED DESCRIPTION OF THE DRAWINGS

Figure 1:
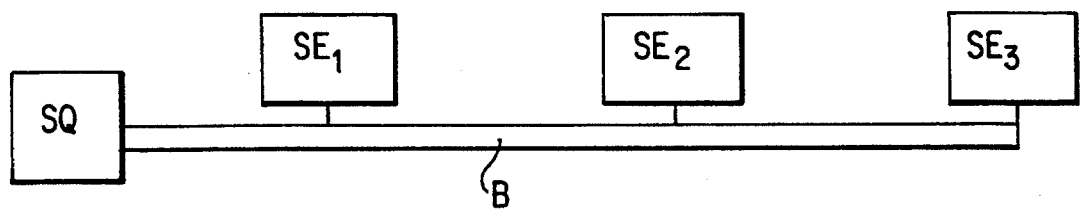
FIG. 1 is a schematic representation of a signal distribution arrangement according to the invention.

FIG. 1 is a schematic representation of several possible embodiments of the signal distribution arrangement according to the invention. At the very top, a signal from source SQ is distributed to several signal receivers $SE_i$ (where i is 1,2,3 . . . ) via individual lines, which are combined in a schematically depicted grouping B. Each of the respective signal receivers $SE_i$ is connected to the source via a single line (not shown individually) within the grouping B. The illustrated arrangement may, for example, be an active antenna, in which a centrally generated signal from the signal source is distributed to the T/R (Transmit/Receive) module, the lines being constructed as glass fibers.

The individual lines within the grouping B are guided along a common path, so that all lines in each path element traverse this common path at least once. This common path, in this case, corresponds to the course of the grouping B of lines from the source SQ to the last signal receiver $SE_3$. The coordinate x of the common path is shown on a coordinate axis along which the positions of the branchings $A_i$ (where i is 1,2,3. . . ) for the signal receivers $SE_i$ are marked. At these points, the corresponding line exits the grouping and connects to the corresponding signal receiver. In this embodiment, the common path forms a straight line. However, other courses, such as curved, star-shaped or circular courses are also possible.

Figure 1A:
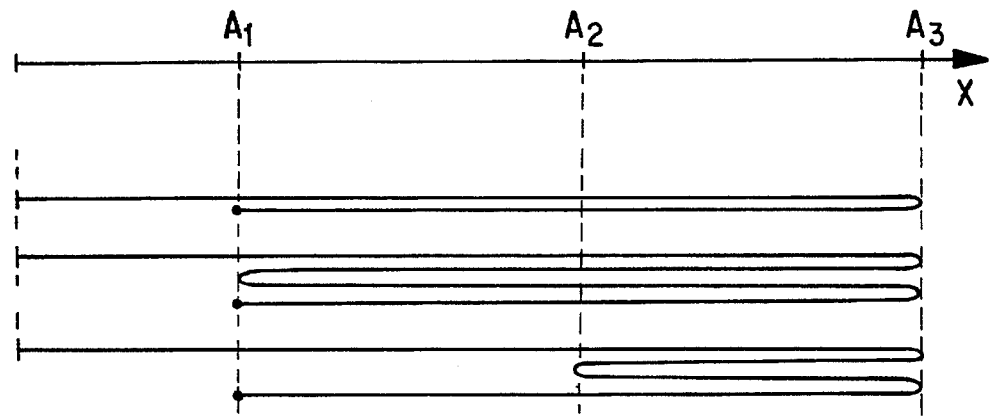
FIGS. 1a)–1c) are schematic representation which illustrate respective examples concerning the multiple layers of lines according to the invention.

FIGS. 1a), 1b), 1c) show schematic examples as to how the lines may be laid in detail within the grouping B.

FIG. 1a) shows three different possibilities for the line which is connected with the first signal receiver $SE_1$. In the first example (top), the line extends from the source, beyond the branch $A_1$ of the signal receiver $SE_1$, to the branch $A_3$ of the third signal receiver $SE_3$, and from there back to branching $A_1$ where it is then connected to the signal receiver $SE_1$. (See FIG. 1). In this example, therefore, between source SQ and branch $A_1$ (the first, signal receiver $SE_1$), the line has a single strand, and is doubled in the remaining area of the common path.

In the second example in FIG. 1a), the line also extends to the end of the common path at the branch $A_3$ of the third signal receiver $SE_3$ and back to the first signal receiver $SE_1$, back again to the branch $A_3$, and only then to the exit at the branch $A_1$ to the signal receiver $SE_1$. In this example, the line has a single strand (an odd number) in the area between the source SQ and the branch $A_1$ of the first signal receiver $SE_1$; and is quadrupled (an even number) between $A_1$ and $A_3$. Finally, in the third example in FIG. 1a), the line is doubled between $A_1$ and $A_2$, and quadrupled between $A_2$ and $A_3$.

Figure 1B:
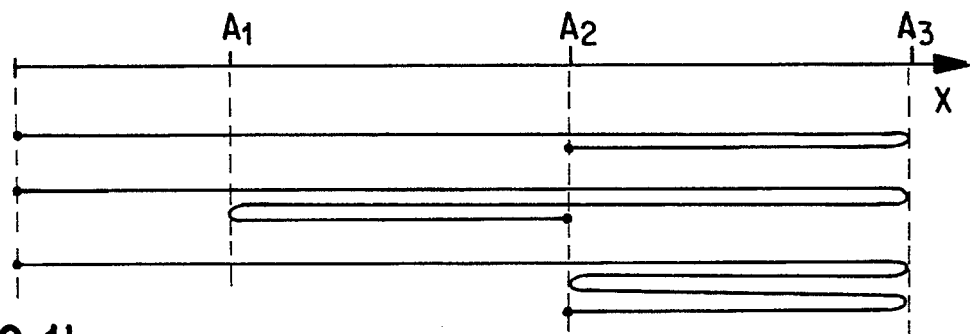
Figure 1C:
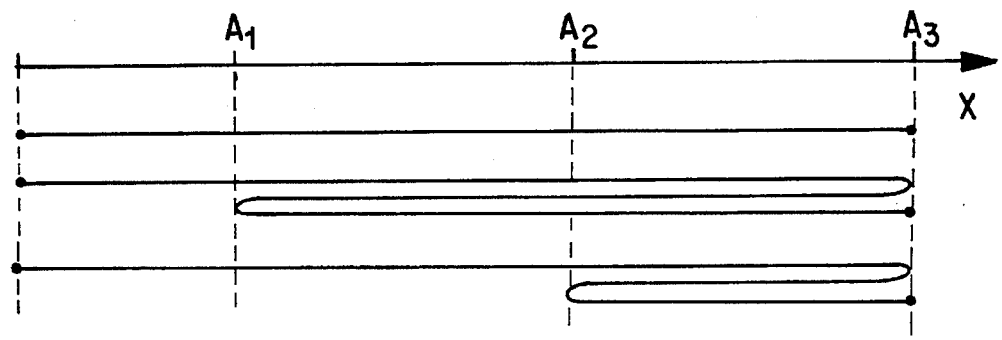

In an analogous manner, FIGS. 1b) and 1c) each show three possible configurations for the line supplying the second signal receiver $SE_2$ and the third signal receiver $SE_3$. (See FIG. 1.)

All of examples in FIG. 1 have in common that the line supplying the i-th signal receiver $SE_i$ has an odd number of strands in the portion of the common path from the source to the i-th branch $A_i$; and has an even number of strands from the i-th branch to the end of the common path.

The representation in FIG. 1 shows only the technique of multiple lapping of the lines along individual sections of the common path. It does not show further measures for dividing the lines into individual sections of different relative sensitivity, such as may be achieved by the suitable selection of materials or the adjustment of the quotient ds/dx. In the latter case, the lines do not extend in a straight line within the grouping B, as indicated in FIG. 1, but rather may follow a helical locus, curvatures or other suitable two- or three-dimensional paths, as shown in FIG. 2.

Figure 2A:
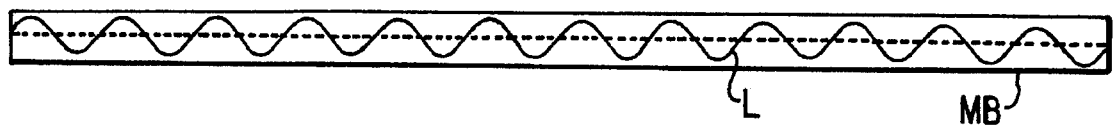
FIGS. 2a) and 2b) illustrate the locus of two individual lines, with specific values for the relative sensitivity.
Figure 2B:
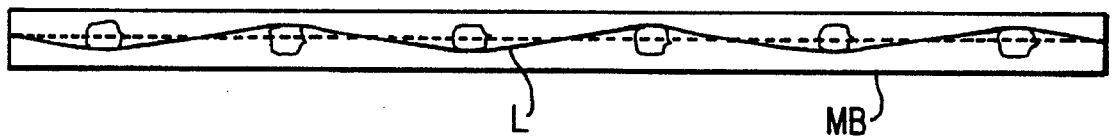

FIG. 2 shows two geometrically flat solutions for the problem of routing lines, particularly glass fibers, along a locus that has a sensitivity to temperature changes which is quantitatively one and a half times (FIG. 2a)) or double (FIG. 2b)) that of a straight line. In order to reduce transverse and longitudinal thermal gradients due to outside heat radiation, the lines are mounted on a good heat conductor, such as a metallic band carrier MB, which typically has a width of a few centimeters.

In FIG. 2a), the line L has a wave or sinusoidal shape, with a quotient ds/dx=1.5. (The coordinate s is measured along line L. The coordinate x is measured along the interrupted line which is straight in this case, and corresponds to the course of the common path or of the line grouping B according to FIG. 1 in which several lines are combined.) The value indicated for ds/dx is an average value obtained by taking the mean along a larger length element $\Delta x$. Since in many applications the disturbances along the path are relatively slow (viewed physically), only this average value is relevant in that case.

In FIG. 2b, additional small loops are inserted in line L at regular intervals, so that the line has a value of ds/dx=2.

The embodiments illustrated in FIGS. 2a) and 2b), and also a three-dimensional helical line, are insensitive to arbitrary uniform local temperature gradients (in all directions of the plane). Gradients of a higher order may be sufficiently suppressed with respect to the environment by means of a simple insulation. This insensitivity applies to all symmetrically designed arrangements.

Figure 3:
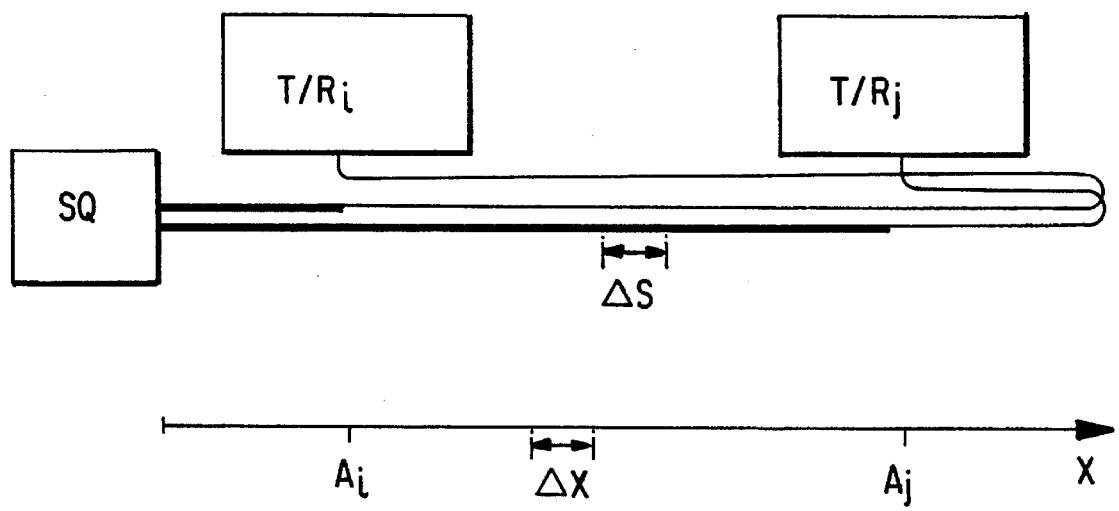
FIG. 3 is a view of an embodiment of a signal distribution arrangement according to the invention.

FIG. 3 shows an advantageous embodiment of the signal distribution arrangement according to the invention. Two T/R-modules $T/R_i$, $T/R_j$ (where i is 1,2,3 and j is 1,2,3 . . .) of an active antenna are supplied with a centrally generated signal via glass-fiber-optical lines. As a rule, such an active antenna has a large number of T/R-modules (>100), and the modules illustrated in FIG. 3 are to be understood as representative of these modules with the pertaining feed lines. The two illustrated modules need not be directly adjacent. Any number of additional modules may be arranged between the two modules as well as in front of module $T/R_i$ and behind module $T/R_j$.

The object of the illustrated arrangement is to compensate for thermal influences on the beaming quality of the antenna. By the suppression of differential transit time fluctuations (between the modules), the phase of the antenna and therefore of its Fraunhofer region is not changed in an unacceptable manner.

Figure 6:
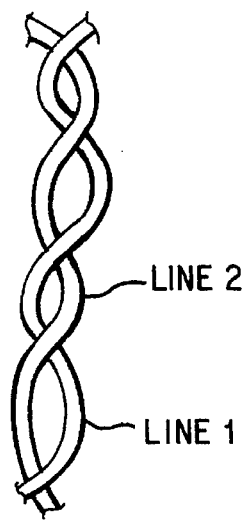
FIG. 6 shows a twisted pair of signal transmitting lines.
Figure 7:
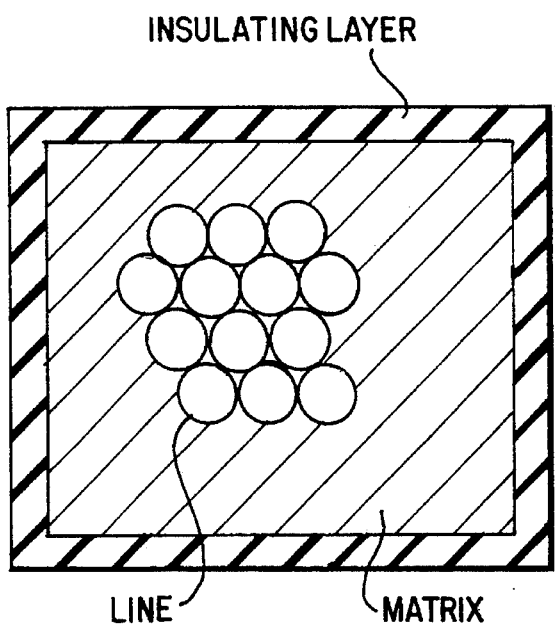
FIG. 7 shows a plurality of lines embedded in a matrix which forms an insulated common path therefor.

The signal is fed into the lines at the signal source SQ and is distributed to the different modules. The lines of all modules follow the same path and are thus subjected to the same outside disturbances. The coordinate axis x for the common path is also shown, with the position of the branches for the individual modules entered on the x-coordinate axis. The lines which extend in parallel are brought as close to one another as possible or are mutually wound around and combined to form a grouping of lines 1 and 2, as shown, for example, in FIG. 6. For reasons of clarity, they are drawn here at a finite distance from one another.

The line to module $T/R_i$ follows the common path beyond branch $A_i$ to the end of the common path, and then back to $A_i$ and into the module $T/R_i$. The line to module $T/R_j$ also follows the whole common path and then returns to $A_j$ and the pertaining module $T/R_j$.

Each line, from the input of the light at the signal source, to the connection to the T/R-module, may be divided into two sections. The first section, marked by a thick line (and called type U), traverses the common path an odd number of times (in this case, once). This section is used to transport the signal from one end to the other. The other section, marked by a thin line (and called type G), traverses the common path an even number of times (in this case, twice, i.e., a loop). The line is extended through this section in order to achieve the same signal transit time and the same phase changes due to outside disturbances along any path elements $\Delta x$ in all lines. In the case of this loop, the input and the output of the line are situated closely next to one another.

So that the overall sensitivity of the lines to outside disturbances is identical with respect to one another, the lines have in the sections of type U and type G a specific value $E_U = s'_U * p_U$ and $E_G = s'_G * p_G$ respectively for the relative sensitivity. ($E_u$ is the relative sensitivity in the section of type U; $s'_u$ is the first derivation ds/dx for the section of type U, and $p_u$ is the ratio of propagation speed of a signal in the section of U type relative to a standard line, as noted previously in Equation 2.) In the illustrated example, the type U line sections, which are drawn by a thick line, are laid in a straight line ($s'_U=1$) and are made of a material of a certain $P_U$; the type G line sections, which are drawn by a thin line, are also laid in a straight line ($S'_G=1$). However, they consist of a material having a different $p_G$.

According to the invention, the following applies to the general case in which, within a path segment $\Delta x$ (such as between $A_i$ and $A_j$) along the common path, one line is laid (2n+1) times (type U) with the relative sensitivity $E_U$, and the other line is laid 2m times (type G) in the same path element with the relative sensitivity $E_G$:

$$(2n+1)*E_U = 2m*E_G.$$

As noted previously, the relative sensitivity $E_U$, $E_G$ can be adjusted by a proper selection of the conductor materials (variation of $p_G$ and $p_U$) or by the adjustment of a certain s'=ds/dx; in the manner shown, for example in FIG. 2 (where n=0, m=1). As mentioned above, the $\Delta x$, within which the above equation applies, is a function of the amount of the physical change of the outside disturbance. Often, viewed physically, the disturbances fluctuate sufficiently "slowly" (that is, relative to changes in the variable x) that $E_U$, $E_G$ in the above equation represent values which were obtained by taking the mean value of the path segment $\Delta x$.

Preferably, the following values are used along a path element $\Delta x$, for example, between $A_i$ and $A_j$:

triple laying (n=1) with $s'_U$=ds/dx=1; that is, linear laying without windings, or similar shapes.

$$(2n+1)*s'_U = 3*1 = 3$$

double laying (m=1) with $s'_G=ds/dx=1.5$ (for example, in the shape of a helical line)

$$2m*s'_G=2*1.5=3$$

Thus the overall sensitivity within the path element is the same for both lines.

In further embodiments (not shown here), in which the distance from branch $A_i$ to the T/R-module i is so large that it can no longer be neglected for the compensation of outside disturbances, all lines may, in addition, follow a common path from branch $A_i$ to the T/R module i. In this case, the line for the i-th module would traverse an odd number of times (2n+1 times), and all other lines an even number of times (2m times=m loops), along this path. In order to avoid beam sweeps because of differential phase errors, it is, however, sufficient for the loops to lead to the modules only in pairs in the case of modules situated symmetrically in the center and not to lead to each module.

Figure 4:
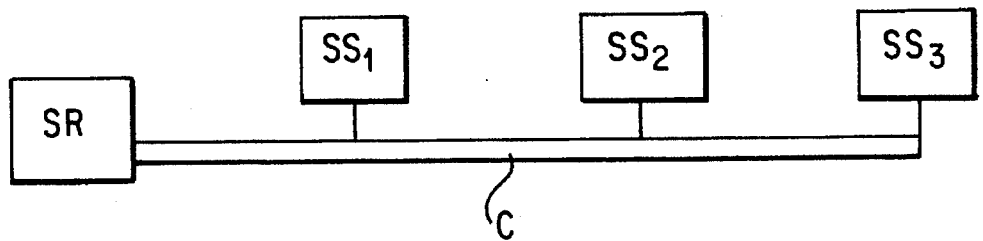
FIG. 4 is a view of an additional embodiment of the invention.
Figure 5:
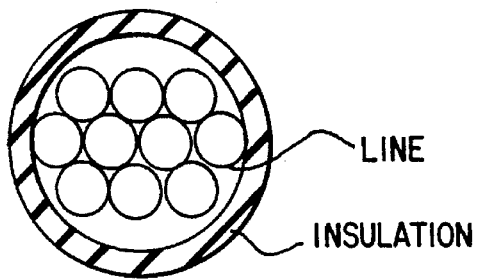
FIG. 5 is a cross-sectional view of an insulated line, suitable for use in the signal distributing apparatus according to the invention.

FIG. 4 shows an additional embodiment of the invention in which signals from a plurality of signal sources are transmitted to a signal receiver. This embodiment thus corresponds to the embodiment of FIG. 1, except that signals are originated at the respective signal sources SS1, SS2, SS3, and transmitted along the lines within the grouping C to the signal receiver SR. The operation of the embodiment of FIG. 4 is analogous to that of FIG. 1.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A signal distribution arrangement comprising:
   a signal source;
   a plurality of signal receivers located along a common path, each of said signal receivers being coupled in communication with said signal source by a respective line arranged within said common path;
   each of said lines having at least two segments within said common path, including a first segment which lies within a portion of the common path that is between said signal source and the corresponding signal receiver to which said respective line is coupled, and a second segment which lies within a portion of the common path that is between said corresponding signal receiver to which said respective line is coupled and an end of said common path;
   each of said lines having a respective relative sensitivity associated with one of said at least two segments which is different from a relative sensitivity associated with at least another of said at least two segments;
   each of said lines being arranged within the common path so that the first segment thereof traverses the common path an odd number of times, and the second segment thereof traverses the common path an even number of times; and
   within each of said at least two segments of each of said lines within the common path, the product of the number of times a respective line traverses said segment and said corresponding relative sensitivity of said respective line being the same for all lines.

2. Arrangement according to claim 1 wherein the respective relative sensitivity is determined by arrangement of said corresponding line within said common path so that $ds/dx \geq 1$, wherein x represents a coordinate position on the common path, s represents a coordinate position along a line and ds/dx represents a first derivative of s with respect to x.

3. Arrangement according to claim 2, wherein ds/dx is determined by arrangement of the respective line within said common path in the shape of a helix having a constant slope, wherein x represents a coordinate position along a common path, s represents a coordinate position along a respective line and ds/dx represents a first derivative of s with respect to x.

4. Arrangement according to claim 1, wherein the respective relative sensitivity is determined by a material of said corresponding line segment, and doping of said corresponding line segment.

5. Arrangement according to claim 4, wherein the respective lines are twisted relative to one another.

6. Arrangement according to claim 1, wherein the respective lines within said common path are insulated against outside disturbances.

7. Arrangement according to claim 1, wherein the respective lines are embedded in a matrix whereby external disturbances are distributed uniformly across a cross-section of all lines in said common path, whereby disturbance gradients are suppressed.

8. Arrangement according to claim 1, wherein the respective lines are twisted relative to one another.

9. Arrangement according to claim 8, wherein the respective lines within said common path are insulated against outside disturbances.

10. A signal collection arrangement comprising:
    a signal receiver;
    a plurality of signal sources located along a common path, each of said signal sources being coupled in communication with said signal receiver by a respective line arranged within said common path;
    each of said lines having at least two segments within said common path, including a first segment which lies within a portion of the common path between said signal receiver and the corresponding signal source to which said line is coupled, and a second segment which lies within the common path between said corresponding signal source to which said respective line is coupled and an end of said common path;
    each of said lines having a respective relative sensitivity associated with one of said at least two segments which is different from a relative sensitivity associated with at least another of said at least two segments;
    each of said lines being arranged within the common path so that the first segment thereof traverses the common path an odd number of times, and the second segment thereof traverses the common path an even number of times; and
    within each of said at least two segments of each of said lines within the common path, the product of the number of times a respective line traverses said segment and said corresponding relative sensitivity of said respective line being the same for all lines.

* * * * *